(12) United States Patent
Feng et al.

(10) Patent No.: US 8,836,440 B2
(45) Date of Patent: Sep. 16, 2014

(54) ELECTROMECHANICAL OSCILLATORS, PARAMETRIC OSCILLATORS, AND TORSIONAL RESONATORS BASED ON PIEZORESISTIVE NANOWIRES

(75) Inventors: Philip X.-L. Feng, Beachwood, OH (US); Luis Guillermo Villanueva, Lyngby (DK); Michael L. Roukes, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 212 days.

(21) Appl. No.: 13/560,037

(22) Filed: Jul. 27, 2012

(65) Prior Publication Data
US 2013/0194048 A1 Aug. 1, 2013

Related U.S. Application Data

(60) Provisional application No. 61/512,316, filed on Jul. 27, 2011.

(51) Int. Cl.
*H03B 5/30* (2006.01)
*H03H 7/00* (2006.01)
*H03B 5/32* (2006.01)

(52) U.S. Cl.
CPC . *H03B 5/32* (2013.01); *H03H 7/00* (2013.01); *H03B 5/30* (2013.01)
USPC .......................... 331/154; 331/116 R; 331/156

(58) Field of Classification Search
USPC ....................................... 331/116 R, 154, 156
See application file for complete search history.

(56) References Cited

U.S. PATENT DOCUMENTS 3,614,678 A * 10/1971 Engeler et al. ................. 333/187
2008/0204152 A1 * 8/2008 Feng et al. ...................... 331/34

* cited by examiner

*Primary Examiner* — Joseph Chang
*Assistant Examiner* — Jeffrey Shin
(74) *Attorney, Agent, or Firm* — Milstein Zhang & Wu LLC; Joseph B. Milstein

(57) ABSTRACT

Doubly-clamped nanowire electromechanical resonators that can be used to generate parametric oscillations and feedback self-sustained oscillations. The nanowire electromechanical resonators can be made using conventional NEMS and CMOS fabrication methods. In very thin nanowire structures (sub-micron-meter in width), additive piezoresistance patterning and fabrication can be highly difficult and thus need to be avoided. This invention shows that, in piezoresistive nanowires with homogeneous material composition and symmetric structures, no conventional and additive piezoresistance loops are needed. Using AC and DC drive signals, and bias signals of controlled frequency and amplitude, output signals having a variety of frequencies can be obtained. Various examples of such resonators and their theory of operation are described.

14 Claims, 22 Drawing Sheets

FIG. 1A
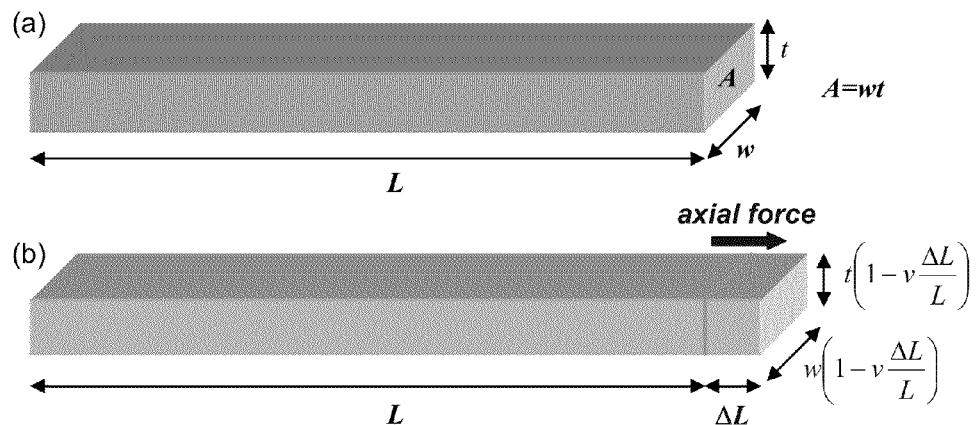
FIG. 1B
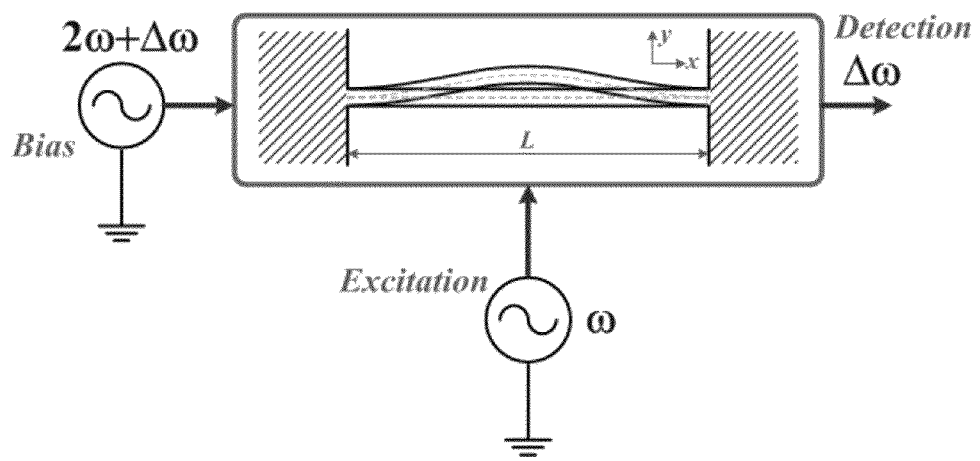
FIG. 6

FIG. 2A
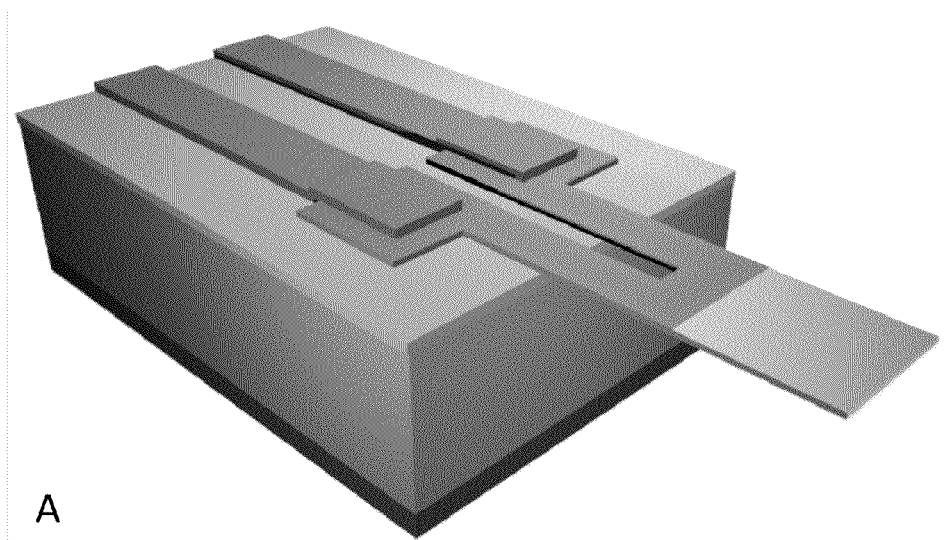
A
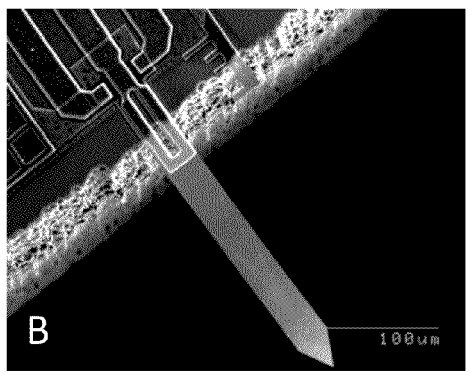
B
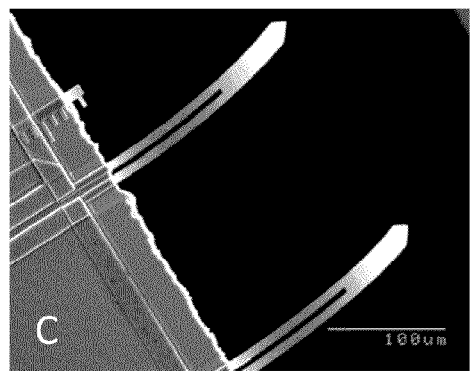
C
FIG. 2B    FIG. 2C

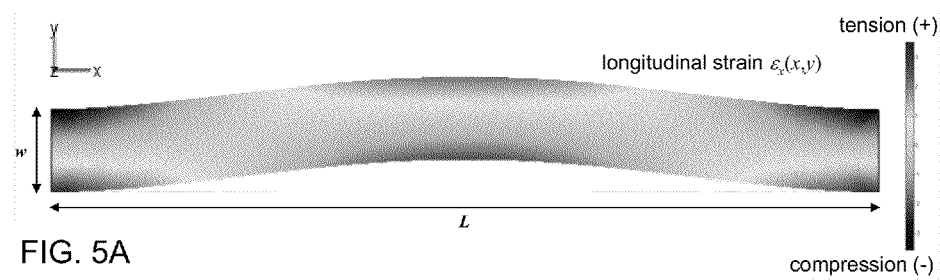
FIG. 5A
FIG. 5B
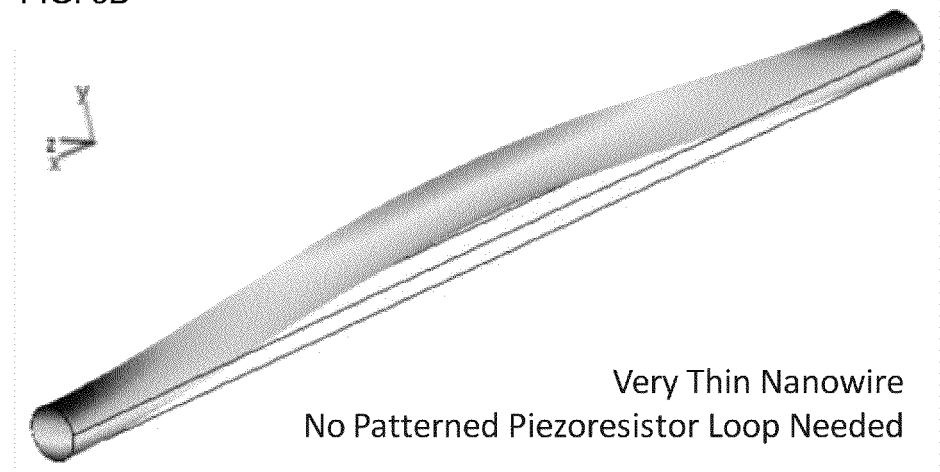
Very Thin Nanowire
No Patterned Piezoresistor Loop Needed

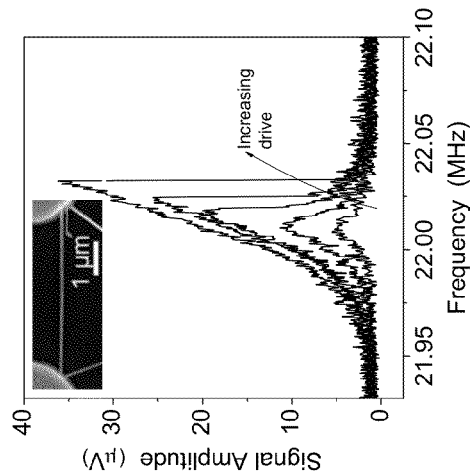
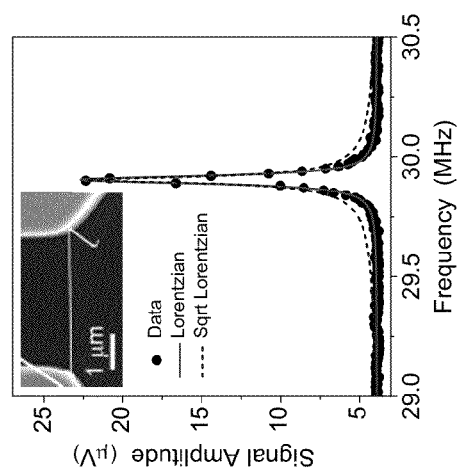
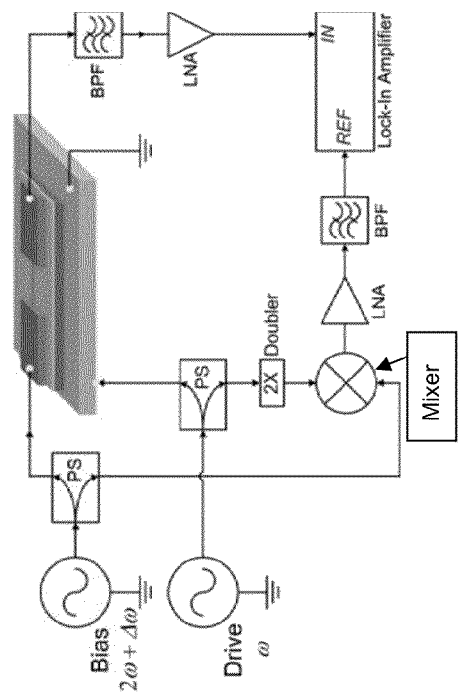
FIG. 7C
FIG. 7B
FIG. 7A

- Si Suspended Wires/Beams
- Clamping/Support
- Gate Electrodes
- Gate (Parametric)

ELECTROMECHANICAL OSCILLATORS, PARAMETRIC OSCILLATORS, AND TORSIONAL RESONATORS BASED ON PIEZORESISTIVE NANOWIRES

CROSS-REFERENCE TO RELATED APPLICATIONS

This application claims priority to and the benefit of U.S. provisional patent application Ser. No. 61/512,316 filed Jul. 27, 2011, which application is incorporated herein by reference in its entirety. This application is also related to U.S. patent application Ser. No. 13/095,692 filed Apr. 27, 2011, which application is incorporated herein by reference in its entirety.

STATEMENT REGARDING FEDERALLY FUNDED RESEARCH OR DEVELOPMENT

This invention was made with government support under N66001-07-1-2039 awarded by Space and Naval Warfare Systems Center. The government has certain rights in the invention.

FIELD OF THE INVENTION

The invention relates to electromechanical and parametric oscillators in general and particularly to resonators and oscillators that employ electromechanical nanostructures.

BACKGROUND OF THE INVENTION

Oscillators are used in a range of applications from reference clocks and frequency references, to distance measurements (e.g., RADAR) and radio technologies. An oscillator is a device that provides an AC output signal at a given frequency in response to an input DC power. Once powered, a self-sustained oscillator continues to oscillate until the power is removed. A resonating system with a positive feedback is typically used to make a self-sustained oscillator. A resonating stage with a positive feedback creates a nonlinear system which maintains oscillations at a given frequency ($\omega_0$) and given amplitude ($A_{osc}$).

There is a need for improved electromechanical oscillators, parametric oscillators, and torsional resonators.

SUMMARY OF THE INVENTION

According to one aspect, the invention features an electromechanical resonant apparatus, comprising a doubly clamped nanowire electromechanical resonator having a fundamental flexural frequency $\omega$ and having sufficient conductivity to provide a piezoresistive signal, the doubly clamped nanowire electromechanical resonator having an excitation input terminal, a bias input terminal, and a resonator output terminal, the doubly clamped nanowire electromechanical resonator configured to generate a piezoresistive signal at a frequency of $2\omega$ (twice the fundamental flexural frequency $\omega$) in response to an applied excitation signal, and configured to generate a capacitive signal at the fundamental flexural frequency $\omega$ in response to an applied excitation signal, and to provide the generated signal at the resonator output terminal; an excitation source configured to provide at an output terminal thereof the excitation signal to the excitation input terminal of the doubly clamped nanowire electromechanical resonator, the excitation source having a terminal configured to be connected to a reference voltage, and having a control for controlling at least one of an amplitude and a frequency of the excitation signal; and a bias source configured to provide at an output terminal thereof a bias signal to the bias input terminal of the doubly clamped nanowire electromechanical resonator, the bias source having a terminal configured to be connected to a reference voltage, and having a control for controlling at least one of an amplitude and a frequency of the bias signal.

In one embodiment, the bias source applies a DC bias signal and the output signal of the doubly clamped nanowire electromechanical resonator is observed at a frequency equal to $2\omega$.

In another embodiment, the bias source applies an AC bias signal at a frequency $2\omega+\Delta\omega$ and the output signal of the doubly clamped nanowire electromechanical resonator is observed at a frequency equal to $\Delta\omega$.

In yet another embodiment, the apparatus further comprises a controller for controlling the excitation source and for controlling the bias source.

In still another embodiment, the controller is a general purpose programmable computer configured to operate under instructions recorded on a machine readable medium.

In a further embodiment, the electromechanical resonant apparatus is an electromechanical oscillator.

In yet a further embodiment, the electromechanical resonant apparatus is a parametric oscillator.

In an additional embodiment, the electromechanical resonant apparatus is a torsional resonator.

In one more embodiment, the doubly clamped nanowire electromechanical resonator has two excitation input terminals and is configured to receive excitation signals at each excitation input terminal.

In still a further embodiment, the excitation source comprises an AC excitation source and a DC excitation source.

In one more embodiment, the doubly clamped nanowire electromechanical resonator comprises a plurality of doubly clamped nanowire electromechanical resonators.

In still a further embodiment, the apparatus comprises a plurality of resonator output terminals, wherein a first of the plurality of resonator output terminals is configured to provide an output signal of frequency $\omega$, and a second of the plurality of resonator output terminals is configured to provide an output signal of frequency $2\omega$.

According to another aspect, the invention relates to a method of generating a parametric oscillation signal. The method comprises the steps of: providing an electromechanical resonant apparatus; applying an excitation signal having frequency $\omega$ and having a desired excitation amplitude; and receiving as output a parametric oscillation signal having a frequency $2\omega$ (twice the fundamental flexural frequency $\omega$) if the desired excitation amplitude is greater than the oscillation threshold. The electromechanical resonant apparatus comprises a doubly clamped nanowire electromechanical resonator having a fundamental flexural frequency $\omega$ and having sufficient conductivity to provide a piezoresistive signal, the doubly clamped nanowire electromechanical resonator having an excitation input terminal, a bias input terminal, and a resonator output terminal, the doubly clamped nanowire electromechanical resonator configured to generate a piezoresistive signal at a frequency of $2\omega$ (twice the fundamental flexural frequency $\omega$) in response to an applied excitation pumping signal having an amplitude greater than an oscillation threshold, and to provide the generated signal at the resonator output terminal; an excitation source configured to provide at an output terminal thereof the excitation signal to the excitation input terminal of the doubly clamped nanowire electromechanical resonator, the excitation source having a terminal configured to be connected to a reference voltage, and having a control for controlling at least one of an amplitude and a frequency of the excitation signal; and a bias source configured to provide at an output terminal thereof a bias signal to the bias input terminal of the doubly clamped nanowire electromechanical resonator, the bias source having a terminal configured to be connected to a reference voltage, and having a control for controlling at least one of an amplitude and a frequency of the bias signal.

In one embodiment, a bias signal having a desired bias frequency and having a desired bias amplitude is provided at the bias input terminal, and receiving as output a parametric oscillation signal at a frequency $2\omega$ if the bias signal is a DC signal, and receiving as output a parametric oscillation signal at a frequency equal to $\Delta\omega$ if the bias signal is an AC bias signal at a frequency $2\omega+\Delta\omega$.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 1A is a diagram showing the dimensions of an undistorted rectangular nanomechanical resonator having a length L, a width w and a thickness t.

FIG. 1B is a diagram showing the dimensions of the rectangular nanomechanical resonator while it is being subjected to an excitation that changes its length from L to L+$\Delta$L.

FIG. 2A is an illustration showing a typical design of a piezoresistive cantilever nanomechanical resonator fabricated in silicon. A feature is the loop which functions as the piezoresistor (i.e., the piezoresistor loop).

FIG. 2B is an image showing an example of a piezoresistive cantilever. The length scale shown is 100 µm long.

FIG. 2C is an image showing a pair of piezoresistive cantilevers. The length scale shown in 100 µm long.

FIG. 5A is a diagram showing the locations of tension and compression that occur when a doubly clamped nanomechanical oscillator is subjected to an excitation that deflects it off its axis and changes its length from L to L+$\Delta$L.

FIG. 5B shows these effects in a three-dimensional view, for a generic nanowire structures with cylindrical or close-to-cylindrical cross section.

FIG. 6 is a diagram showing a nanowire resonator signal transduction apparatus that operates according to principles of the invention, and that can be used for open loop characterization of nanowire resonators.

FIG. 7A is a schematic diagram of a measurement circuit for a high frequency Si nanowire resonator with piezoelectric actuation and piezoresistive self-detection, having a drive signal source, a bias signal source, power splitters (PS), a frequency doubler (2×), a mixer, band pass filters (BPF), and low noise amplifiers (LNA).

FIG. 7B is a diagram showing the data (the solid circles) taken for a 80 nm thick, 4.6 µm long nanowire resonator (shown in the inset).

FIG. 7C is a diagram showing the nonlinear vibration from a 88 nm thick, 4.9 µm long nanowire (shown in the inset).

DETAILED DESCRIPTION

Figure 3:
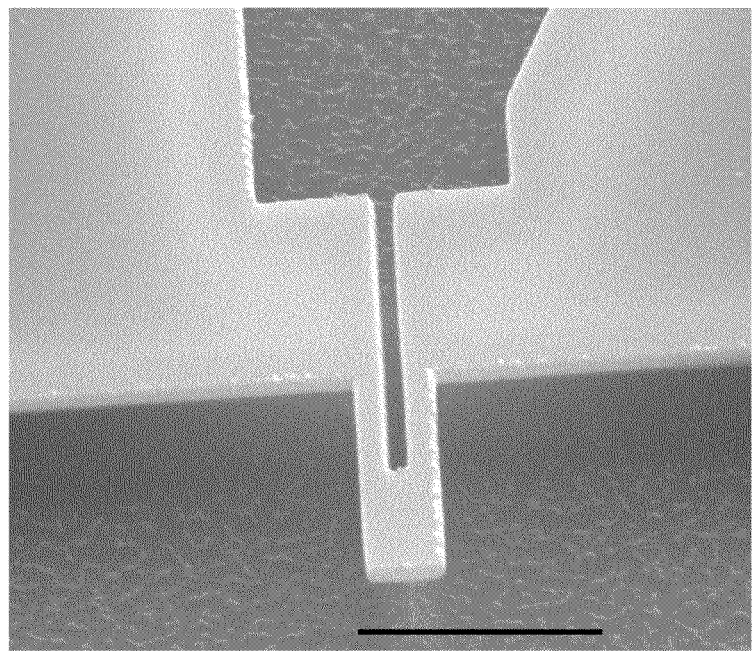
FIG. 3 is a diagram showing a nanomechanical oscillator fabricated in silicon. The length scale shown is 2 µm long.

We describe new techniques and designs for realizing active, self-sustained oscillators and parametric oscillators based on nanowire (NW) electromechanical resonators. For the purposes of this disclosure, a nanowire electromechanical resonator can have a cross section selected from various cross sectional forms, including by way of example a square cross section, a rectangular cross section, a trapezoidal cross section, a circular cross section, or an oval cross section. For a doubly-clamped nanowire electromechanical resonator vibrating at its fundamental flexural frequency ω, we have devised novel electromechanical transduction schemes by exploiting the 2ω piezoresistive (PZR) effect in the nanowire due to wire elongation. When vibrating at frequency ω, the nanowire elongation is occurring at frequency 2ω, and therefore a homogenous piezoresistive nanowire itself can produce a 2ω piezoresistive signal which can be exploited for device signal processing. When a resonator having a fundamental frequency ω and having sufficient conductivity to provide a piezoresistive signal is excited with a sufficiently large signal having frequency ω, a response signal having a frequency 2ω is generated. Such sensitive signal transduction schemes readily scale well into the high-frequency bands (e.g., VHF/UHF, 30 MHz-1 GHz) for radio-frequency (RF) operations. We have designed various feedback control schemes to realize self-sustained stable oscillators, where we utilize both ω feedback and 2ω parametric pumping feedback to realize active oscillators (with clock frequency at ω) and parametric oscillators (clock frequency at 2ω). We have also devised a novel transduction scheme for high-Q torsional resonators supported by piezoresistive nanowires. All the NW resonators and control circuits can be fabricated using state-of-the-art IC manufacturing processes and are integrated using system-on-chip technologies.

Our description of the disclosure is divided into four sections:
1. Piezoresistive (PZR) Effect and The 2ω Piezoresistive Effect in Vibrating Thin Nanowires
2. Piezoresistive Nanowire Oscillators (clock frequency at ω)
3. Piezoresistive Nanowire Parametric Oscillators (clock frequency at 2ω)
4. Torsional Resonators with Piezoresistive Nanowires The Piezoresistive (PZR) Effect The piezoresistive effect is the effect in which a device's resistance changes when strain (stress) is developed in the constitutive material due to applied forces. FIG. 1A and FIG. 1B illustrate the dimensional changes that occur under the applied stress, which give rise to the piezoresistive effect. The resistance R of a conductor is given by the well known formula $$R = \rho \frac{L}{A}$$

where ρ is resistivity, L is length and A is cross-sectional area.

Therefore for an axial strain ε, the strain induced resistance change is given by G·ε, according to the equations presented below.

Axial Strain:

$$\varepsilon = \Delta L/L$$

Strain-Induced Resistance Change:

$$\frac{\Delta R}{R} = \frac{\Delta \rho}{\rho} + \frac{\Delta L}{L} - \frac{\Delta A}{A}$$

$$= \left[(1+2v) + \frac{\Delta \rho/\rho}{\Delta L/L}\right] \cdot \frac{\Delta L}{L}$$

$$= \left[(1+2v) + \frac{\Delta \rho/\rho}{\varepsilon}\right] \cdot \varepsilon \equiv G \cdot \varepsilon$$

Gauge Factor:

$$G \equiv (1+2v) + \frac{\Delta \rho/\rho}{\Delta L/L}$$

The Gauge factor (G) has a geometric effect (1+2 v) that usually dominates for metals, while strain-dependent resistivity variations ((Δρ/ρ)/(ΔL/L), e.g., band structure & carrier mobility) dominate in semiconductors.

Conventionally, piezoresistor loops are patterned and fabricated in the highly strained areas of devices to pick up the PZR signal. One limitation is the need for PZR loops often leads to complicated fabrication, and compromised structure/stacking of materials.

It can be difficult to make PZR structures in very thin wires/beams, having desirable homogeneous structures. Another area that has proven difficult in the past in transduction at VHF/UHF using nanowires and nanoelectromechanical structures (NEMS).

Figure 4:
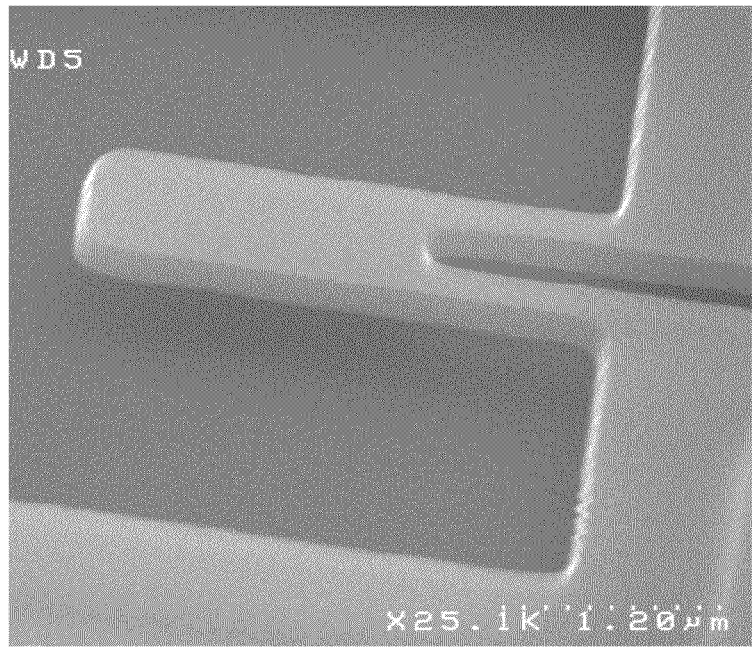
FIG. 4 is a diagram showing another nanomechanical oscillator fabricated in silicon.

Here we show structures that can be fabricated using conventional semiconductor processing methods, including NEMS fabrication methods. FIG. 2, FIG. 3 and FIG. 4 are such structures. FIG. 2 is a diagram showing a pair of nanomechanical oscillators fabricated in silicon. FIG. 3 is a diagram showing a nanomechanical oscillator fabricated in silicon. The length scale shown is 2 μm long. FIG. 4 is a diagram showing another nanomechanical oscillator fabricated in silicon.

The 2ω Piezoresistive (PZR) Effect in Nanowires

In doubly-clamped thin nanowires and nanobeams of homogeneous materials, because of symmetry, the overall PZR effect due to $1^{st}$-order, bending-induced longitudinal strain is zero, because line-, surface-, and body-integrals all vanish.

FIG. 5 is a diagram showing the locations of tension and compression that occur when a doubly clamped nanomechanical oscillator is subjected to an excitation that changes its length from L to L+ΔL.

The $2^{nd}$-order longitudinal strain due to elongation is non-zero. Therefore, the elongation is proportional to the square of the displacement ($x^2$). As a consequence, the resistance change is at twice of the vibration frequency (i.e., at $2\omega$). As shown in the following relation, the longitudinal strain due to elongation is given by:

$$\varepsilon_L = \frac{\Delta L}{L} \approx \frac{1}{2L}\int_0^L \left(\frac{dv}{dx}\right)^2 dx = 2.44\left(\frac{v_c}{L}\right)^2$$

This comes about because the nanowire is elongated twice during each vibrational cycle (once during the positive-going portion of a sinusoid, and again during the negative-going portion of the sinusoid) so as to result in a piezoresistive signal having frequency twice that of the vibration (i.e., a vibration at $\omega$ yields a piezoresistive signal at $2\omega$).

FIG. 6 is a diagram showing a nanowire resonator signal transduction apparatus, which can be characterized in an open loop system. The device illustrated in FIG. 6 uses an excitation at frequency $\omega$, and for a bias at frequency $2\omega+\Delta\omega$ for $2\omega$ PZR down-mixing, detection occurs at frequency $\Delta\omega$. For a bias at DC, detection occurs at frequency $2\omega$. The excitation is applied using a gate electrode. Additional components can be added in order to make measurements of the operational characteristics of such a device, as will be described hereinafter.

$2\omega$ PZR Sensing of Nanowires
Example: Thin Silicon Nanowires

In one embodiment a device that uses a combination of mechanical actuation (via mechanical 'shaking' coupling to a piezo-actuator) gives clean evidence of $2\omega$-piezoresistive self-sensing, $x^2$-detection, and the presence of a stiffening nonlinearity.

FIG. 7A is a schematic diagram of a measurement circuit for a high frequency Si nanowire resonator with piezoelectric actuation and piezoresistive self-detection, having a drive signal source, a bias signal source, power splitters (PS), a frequency doubler (2×), a mixer, band pass filters (BPF), and low noise amplifiers (LNA). The excitation is applied using a gate electrode. A lock-in amplifier is used to detect the $2\omega$ signal that the oscillator generates, by comparing the output of the oscillator with a frequency-doubled drive signal at $\omega$.

FIG. 7B is a diagram showing the data (the solid circles) taken for a 80 nm thick, 4.6 μm long nanowire resonator (shown in the inset). The data are taken at drive voltage $V_d$=0.58 V and bias voltage $V_b$=0.16 V. A best Lorentzian fit (solid line) to the data of the amplitude signal, and a square root Lorentzian fit (dashed curve) to the same data are shown. Both curves are the best achievable fits given the restraints of the peak and background level of the resonance signal.

FIG. 7C is a diagram showing the nonlinear vibration from a 88 nm thick, 4.9 μm long nanowire (shown in the inset). The curves are corresponding to drive voltage $V_d$=0.32, 0.50, 0.63, 0.71, 0.79 V respectively, with the same bias of $V_b$=0.25 V.

$2\omega$ PZR Sensing of Nanowires—Example (Thin Si NWs)

We now describe devices that include on-chip electrostatic actuation, piezoresistive detection and electrostatic tuning. In one embodiment the device has a thickness of d=40 nm, a frequency $f_0$=96 MHz, and a quality factor Q~800. In another embodiment the device has a thickness of d=30 nm, a frequency $f_0$=75 MHz, and a quality factor Q~1000.

Figure 8B:
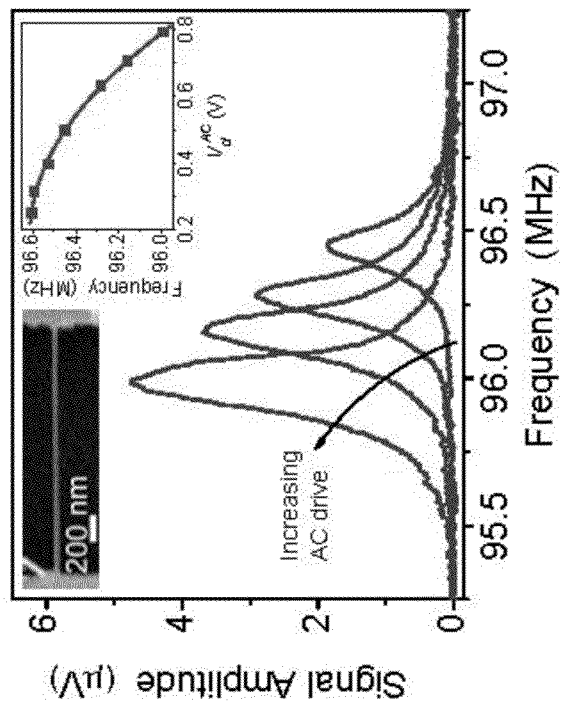
FIG. 8B is a diagram showing the device performance of a 40 nm thick, 96 MHz nanowire resonator with a quality factor Q of ~550.
Figure 8A:
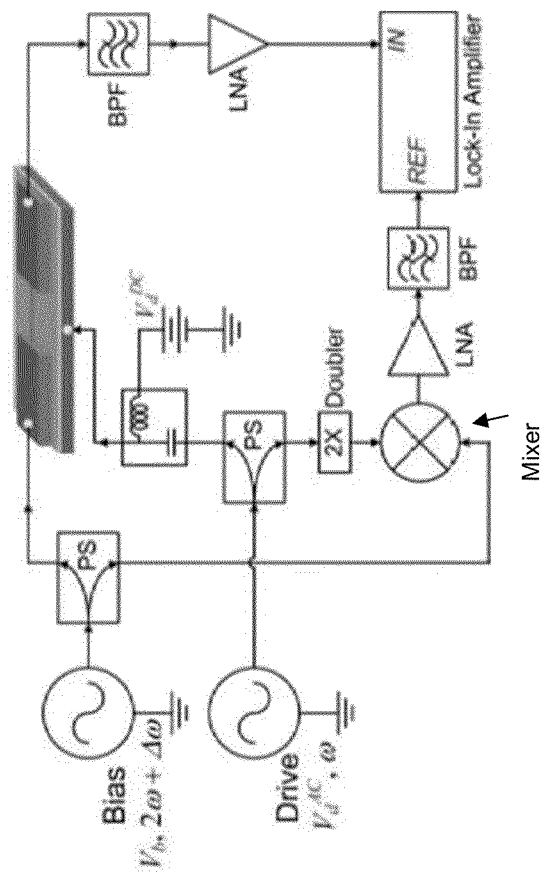
FIG. 8A is a schematic diagram of bias and drive circuitry for a very high frequency Si nanowire resonator with fully integrated electrostatic actuation and piezoresistive self-detection.

FIG. 8A is a schematic diagram of bias and drive circuitry for a very high frequency Si nanowire resonator with fully integrated electrostatic actuation and piezoresistive self-detection. In FIG. 8A there is shown an AC drive that provides a drive voltage operating at frequency $\omega$, and a DC drive that provides a DC drive voltage. An AC bias source that provides a bias signal at a frequency $2\omega+\Delta\omega$ is also present. Detection is accomplished using a lock-in amplifier that receives as a reference a frequency-doubled signal based on the AC drive frequency.

FIG. 8B is a diagram showing the device performance of a 40 nm thick, 96 MHz nanowire resonator with a quality factor Q of ~550. It is 1.8 μm long and has a dc resistance of 80 kΩ. The AC drive is set at $V_d^{AC}$=0.50, 0.63, 0.71, 0.79 V for the curves shown, respectively, with the DC voltage fixed at $V_d^{DC}$=0.2 V. The left inset shows an SEM image of the device, and the right inset shows the drive dependence of the resonance frequency as a function of the magnitude of the AC drive signal.

Figure 8D:
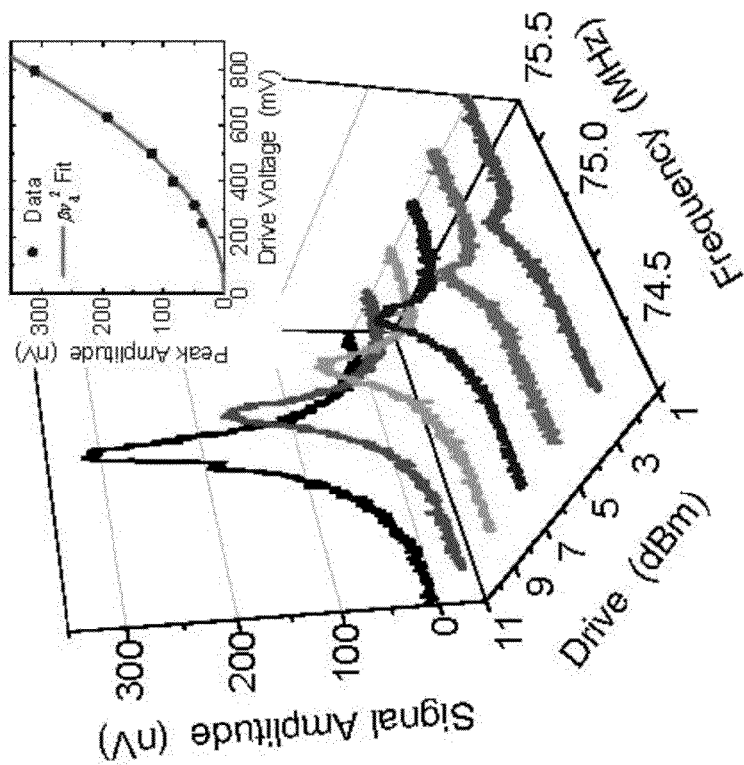
FIG. 8D is a diagram showing the performance of a 30 nm thick, 75 MHz Si nanowire resonator with Q~700, at varying drive levels but constant bias.
Figure 8C:
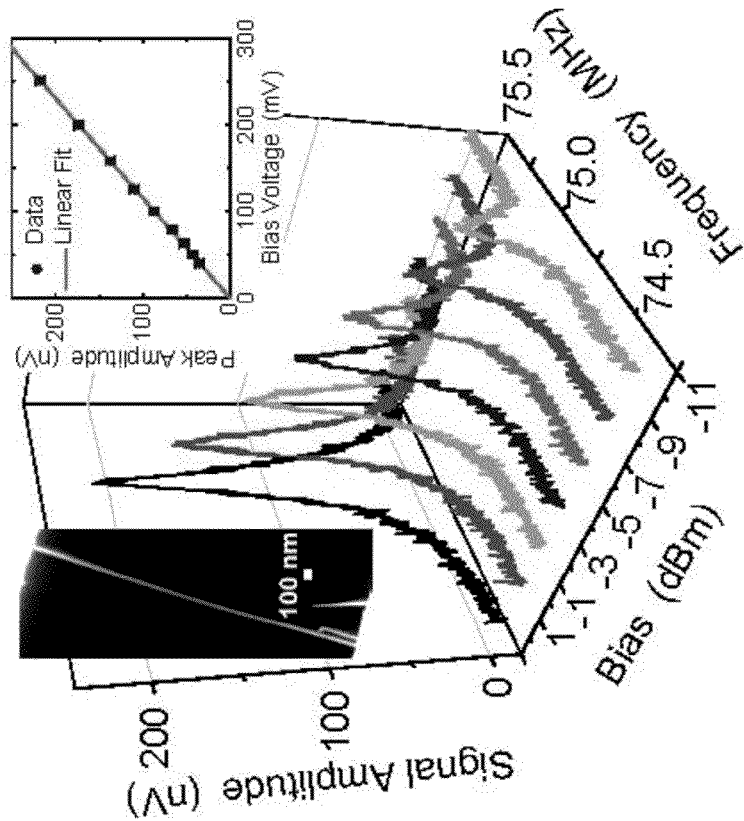
FIG. 8C is a diagram showing the performance of a 30 nm thick, 75 MHz Si nanowire resonator with Q~700, taken at different bias voltages with the same drive.

FIG. 8C is a diagram showing the performance of a 30 nm thick, 75 MHz Si nanowire resonator with Q~700, taken at different bias voltages with the same drive. Its length is 1.8 μm and its dc resistance is 300 kΩ. The left inset shows an SEM image of the device, and the right inset sows the measured bias dependency of the peak amplitude, which is well fitted by a linear fitting curve.

FIG. 8D is a diagram showing the performance of a 30 nm thick, 75 MHz Si nanowire resonator with Q~700, at varying drive levels but constant bias. The inset shows the measured drive voltage dependency of the peak amplitude, which is well fitted by a curve having quadratic dependence on drive voltage.

$2\omega$ PZR Sensing of Nanowires Using Different Embodiments

Figure 9:
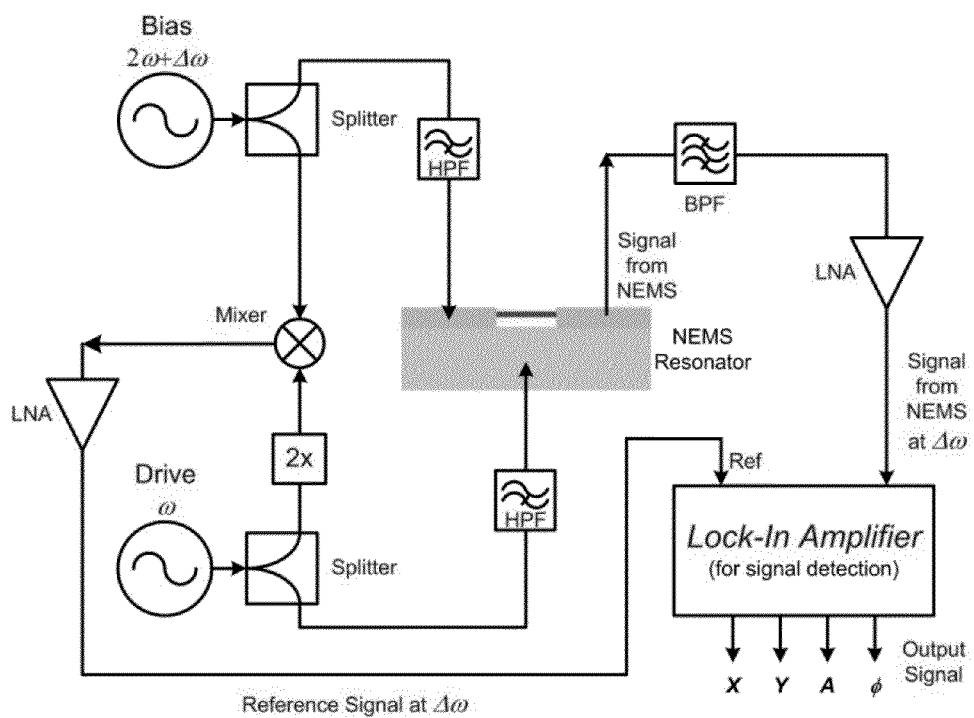
FIG. 9 is a schematic diagram showing a detection circuit with $2\omega$ piezoresistive (PZR) down-mixing.

FIG. 9 is a schematic diagram showing a detection circuit with $2\omega$ piezoresistive (PZR) down-mixing that is used to measure a NEMS resonator. This detection circuit can be used to measure resonators constructed in different ways, including resonators having either top-down or bottom-up nanowires, as will now be described. The circuit elements denoted HPF are high pass filters.

Figure 10A:
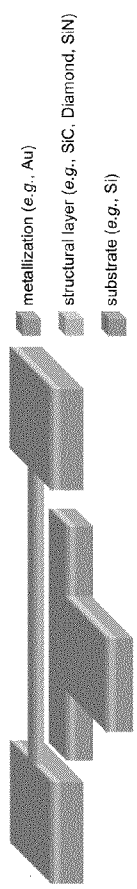
FIG. 10A is a diagram in perspective view showing a nanowire transducer having a metallic PZR transduction layer and the usual structure layers (e.g., Si, SiC, SiN, diamond, etc.).

FIG. 10A is a diagram in perspective view showing a nanowire transducer having a metallic PZR transduction layer and the usual structure layers, for example, fabricated out of material such as Si, SiC, SiN, or diamond. The metallization can be any convenient metal, for example, gold, deposited on a structural layer, fabricated from materials such as SiC, SiN or diamond, which layer is in turn supported by a substrate, such as a silicon wafer. In various embodiments, other materials having suitable conductive, flexural and supportive properties can be substituted for the materials enumerated.

Figure 10B:
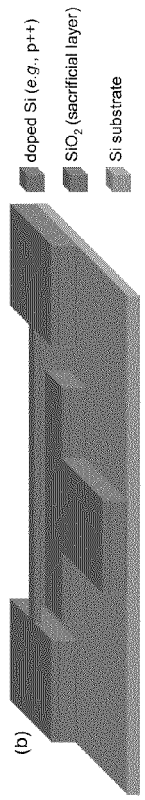
FIG. 10B is a diagram in perspective view showing a nanowire transducer having a PZR semiconductor fabricated from a homogenous single layer material (e.g., doped PZR Si NWs).

FIG. 10B is a diagram in perspective view showing a nanowire transducer having a PZR semiconductor fabricated from a homogenous single layer material, for example a silicon wafer, upon which a sacrificial oxide layer is fabricated, and having a heavily doped silicon layer from which the piezoresistive element is fabricated. The sacrificial layer is removed, for example by etching, to provide the active device. Such a structure can be referred to as a doped piezoresistive silicon nanowire (PZR Si NW) device.

Figure 10C:
FIG. 10C is a diagram in perspective view showing the structure of bottom-up chemically-grown PZR semiconductor NWs.

FIG. 10C is a diagram in perspective view showing the structure of a bottom-up chemically-grown PZR semiconductor NW, in which a silicon substrate has a gate fabricated by heavily doping the silicon, an oxide sacrificial layer is fabricated, and a silicon nanowire (also heavily doped) is then grown. The sacrificial layer is removed, for example by etching, to provide the active device.

Piezoresistive Nanowire Oscillators Operating at a Clock Frequency of ω.

Figure 11A:
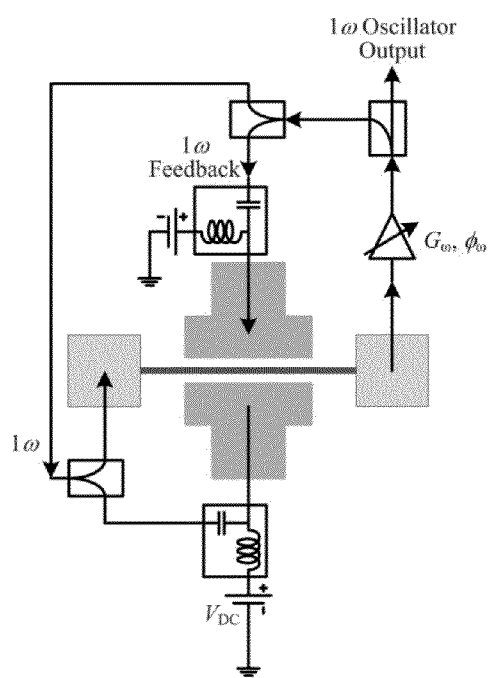
FIG. 11A is a diagram showing device signal transduction in a $2\omega$ PZR down-mixing situation.

We now describe the design and operation of 1ω piezoresistive nanowire (PZR NW) oscillators. In some embodiments, active, self-sustained oscillators using PZR NWs can be employed as frequency references. In the devices that are now described, both PZR NW and feedback control circuits, such as sustaining amplifiers, have been fabricated using a NEMS-CMOS process FIG. 11A is a diagram showing device signal transduction in a 2ω PZR down-mixing in which, the drive is at frequency ω, the nanowire's vibration is at ω, and thus the nanowire's piezoresistance signal is at 2ω. Because the bias signal is at frequency ω, thus in mixing with the 2ω piezoresistance signal, the generated PZR voltage response is at frequency ω, due to down-mixing. This voltage signal at ω is then tuned (in amplitude and phase) and fed back to the drive and bias, to sustain the oscillation system.

After tunable signal amplification and phase compensation, feedback of the ω signal in turn drives the device to compensate the finite loss in the device, thus sustaining the stable oscillation.

Figure 11B:
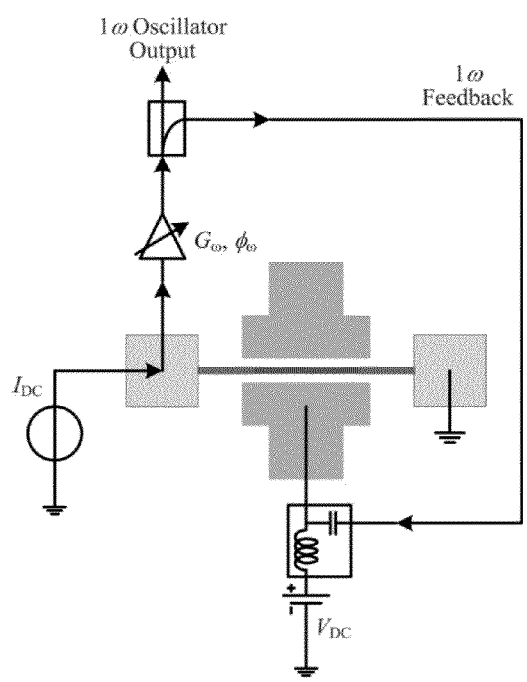
FIG. 11B is a diagram showing device signal transduction in a device selectively doped to have PZR signal at frequency $\omega$ (instead of at frequency $2\omega$), a DC bias, and detection of resonance signal at frequency $\omega$.

FIG. 11B is a diagram showing device signal transduction in a device selectively doped to have PZR signal at frequency ω (instead of at frequency 2ω), a DC bias, and detection of resonance signal at frequency ω. After tuning of the gain and the loop phase change, a feedback signal at frequency ω drives the device to realize stable oscillation.

Oscillator via Parametrically-Enhanced PZR NW Using a Clock Frequency of ω.

In this situation, parametric pumping below the oscillation threshold results in no 2ω self-sustained oscillation. Therefore, one can have 1ω self oscillation based on a parametrically-enhanced PZR NW.

Figure 12A:
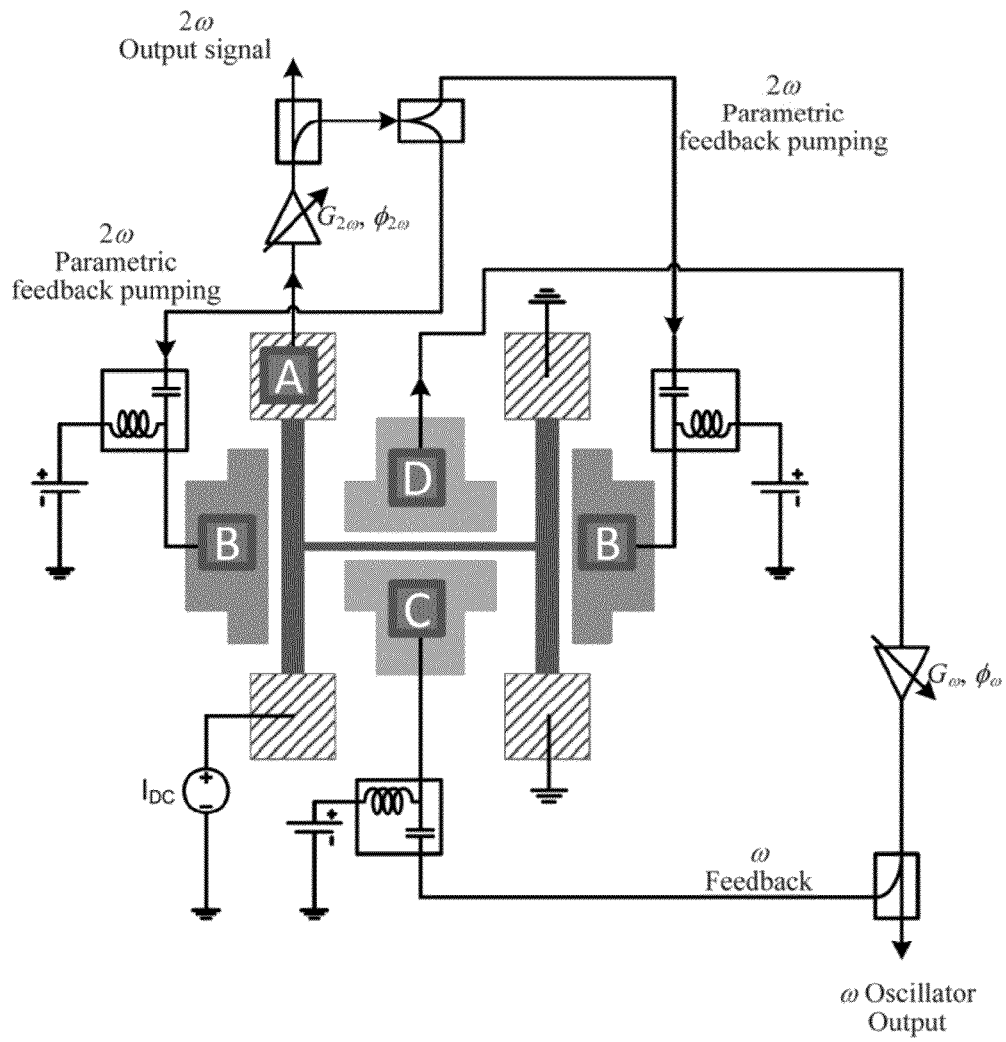
FIG. 12A is a schematic diagram of a nanowire oscillator device that operates via parametrically-enhanced PZR using a clock frequency of $\omega$, using two loops, on at frequency $\omega$ and another one (the parametric pump) at frequency $2\omega$ having two pumps.

FIG. 12A is a schematic diagram of a nanowire oscillator device that operates via parametrically-enhanced PZR nanowire resonator using a clock frequency of ω, using two pumps applied to gates B. The NW vibration occurs at the resonance frequency ω, which is detected using gate D by a linear detection mechanism, such as a capacitive, suspended gate transistor, a suspended body transistor, or an equivalent device. After appropriate gain tuning and phase shifting, the signal is input into gate C in order to generate an oscillator. Here only a signal at frequency ω has been used.

In parallel with DC bias going through the PZR NW, at node A the PZR signal can be transduced at frequency 2ω. This 2ω signal, with desirable amplification and phase change, can be used to parametrically pump the resonating NW at gates B. This signal, when it is below the instability threshold, can be used to enhance the quality factor of the NW resonance and, therefore, reduce the phase noise of the resulting self-oscillating system.

Figure 12B:
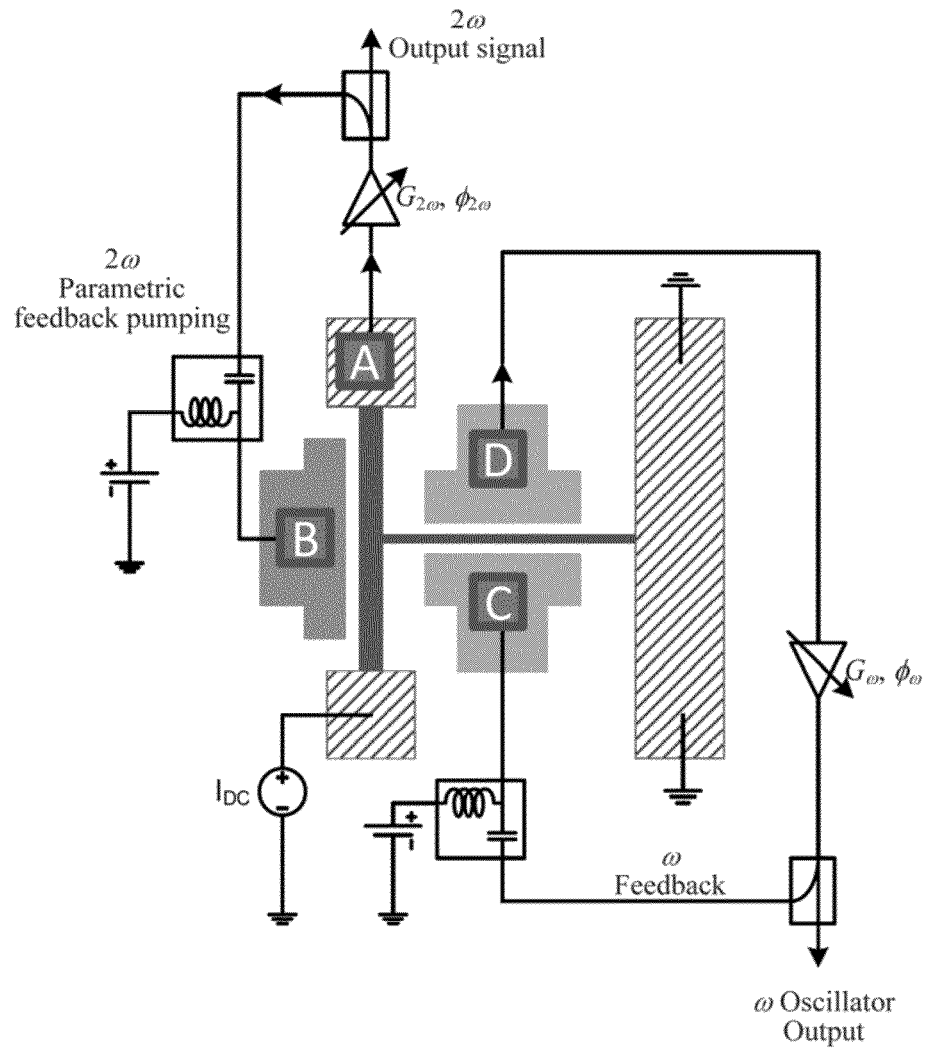
FIG. 12B is a schematic diagram of a nanowire oscillator device similar to that of FIG. 12A that operates via parametrically-enhanced PZR using a clock frequency of $\omega$, but having a singular pumping signal.

FIG. 12B is a schematic diagram of a nanowire oscillator device similar to that of FIG. 12A that operates via parametrically-enhanced PZR using a clock frequency of ω, but having a singular pumping signal applied to a single gate B. This is a variant of the situation in FIG. 12A, where one clamping port of the PZR nanowire is rigid and not movable.

Piezoresistive Nanowire Parametric Oscillators Using a Clock Frequency of 2ω.

We now describe system that use a frequency 2ω feedback control signal to realize parametric oscillators based on PZR NW structures by tuning the frequency via electrostatic force. Superposition of the use of frequency ω feedback control signal may lead to both a frequency 1ω oscillator and a frequency 2ω oscillator locked onto the frequency 1ω electromechanical resonance of the same PZR NW.

Figure 13A:
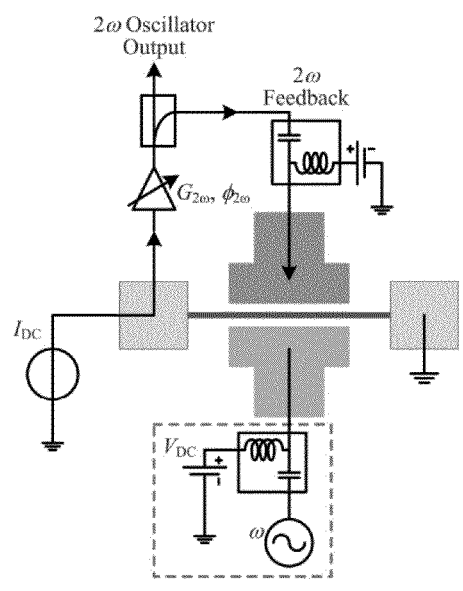
FIG. 13A is a diagram showing a piezoresistive nanowire parametric oscillator using a clock frequency of $2\omega$.

FIG. 13A is a diagram showing a piezoresistive nanowire parametric oscillator using a clock frequency of 2ω. The oscillator operates using DC bias, electrostatic actuation at frequency ω to initially set the system beyond oscillation threshold, and frequency 2ω PZR transduction. After tunable signal amplification and phase compensation, feedback of the frequency 2ω signal in turn parametrically pumps the device to above the threshold, thus sustaining the stable oscillation, with vibration at frequency ω, and clock output at frequency 2ω.

Figure 13B:
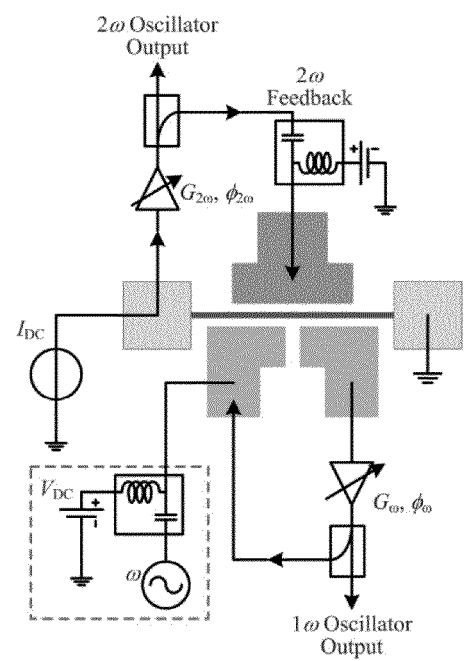
FIG. 13B is a diagram showing another piezoresistive nanowire parametric oscillator using a clock frequency of $2\omega$.

FIG. 13B is a diagram showing another piezoresistive nanowire parametric oscillator using a clock frequency of 2ω. The oscillator operates using DC bias, electrostatic excitation at frequency ω to initially set the system beyond oscillation threshold, and frequency 2ω PZR transduction. The frequency ω clock signal is applied to a split gate, allowing a frequency ω oscillation signal to be detected and used as a source for additional feedback. Both frequency ω and frequency 2ω feedback control signals can lock on to the NW resonance, thus realizing 2 active clocks at frequency ω and frequency 2ω. This case is equivalent to FIG. 12A, and FIG. 12B, but the pump is applied in a different manner.

Piezoresistive Nanowire Parametric Oscillators Using a Clock Frequency of 2ω

We now describe parametric mechanical-pumping enabled PZR NW oscillators.

Figure 14A:
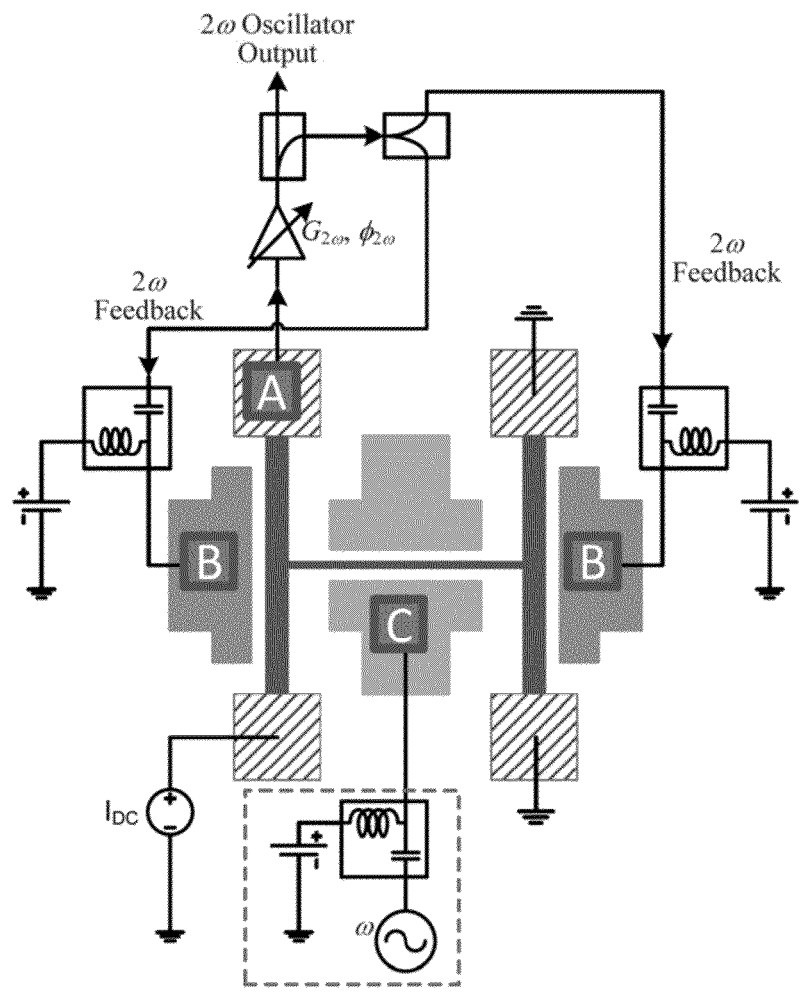
FIG. 14A is a diagram showing another piezoresistive nanowire parametric oscillator using a clock frequency of $2\omega$.

FIG. 14A is a diagram showing another piezoresistive nanowire parametric oscillator using a clock frequency of 2ω. Vibration of the NW occurs at the resonance frequency ω. The transduced signal observed at gate A is at frequency 2ω. With tunable gain and phase change, this frequency 2ω signal is used to parametrically pump the resonating NW at gates B. When the gain is high enough, this pumping will be beyond the instability threshold and therefore the resonator enters into self-sustained oscillation. Here the signal imposed upon the gates B pumps the supporting beams for the PZR NW, modulating its longitudinal stress at frequency 2ω. In addition, in open-loop test/calibration, an excitation signal can be put through gate C. This signal is not necessary for building the parametric oscillator.

Figure 14B:
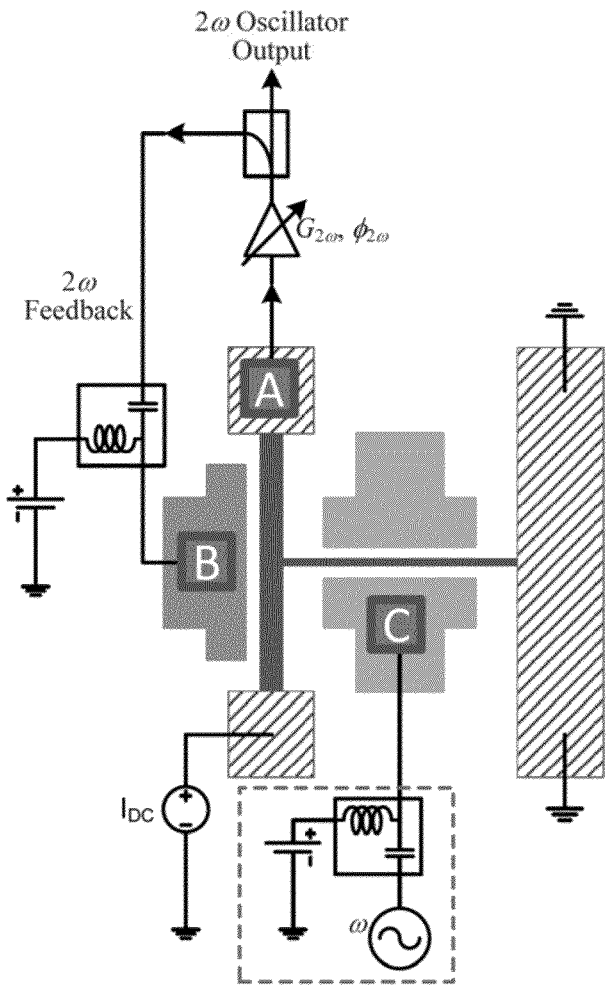
FIG. 14B is a diagram showing yet another piezoresistive nanowire parametric oscillator using a clock frequency of $2\omega$ that is similar to the parametric oscillator of FIG. 14A, but that uses a singular pumping beam.

FIG. 14B is a diagram showing yet another piezoresistive nanowire parametric oscillator using a clock frequency of 2ω that is similar to the parametric oscillator of FIG. 14A, but that uses a singular pumping beam.

Parametric Oscillator via PZR NW Arrays Using a Clock Frequency of 2ω

We have devised methods of engineering coupled resonators in parallel, for example using mechanical or reactive coupling mechanisms to enable PZR NW arrays. These devices are similar to previous configurations. Here the coupled PZR NW arrays function as the frequency references for the oscillators.

Figure 15A:
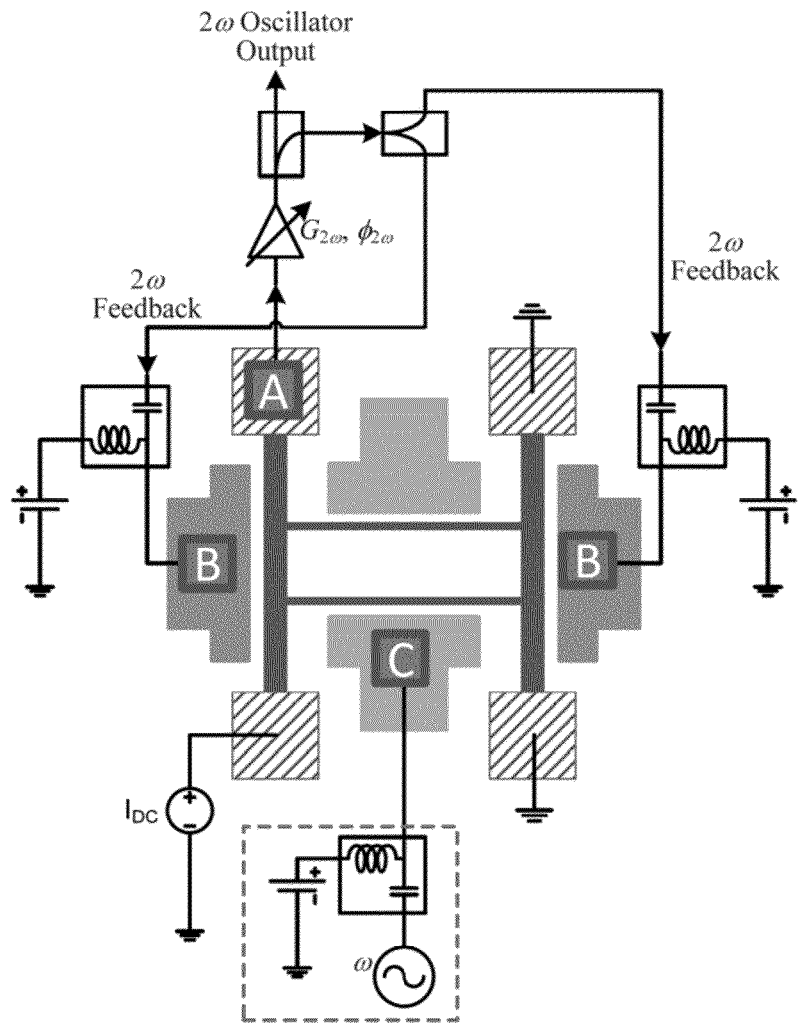
FIG. 15A is a diagram showing a piezoresistive nanowire parametric oscillator in which the coupled PZR NW arrays function as the frequency references for the oscillators.

FIG. 15A is a diagram showing a piezoresistive nanowire parametric oscillator in which the coupled PZR NW arrays function as the frequency references for the oscillators.

Figure 15B:
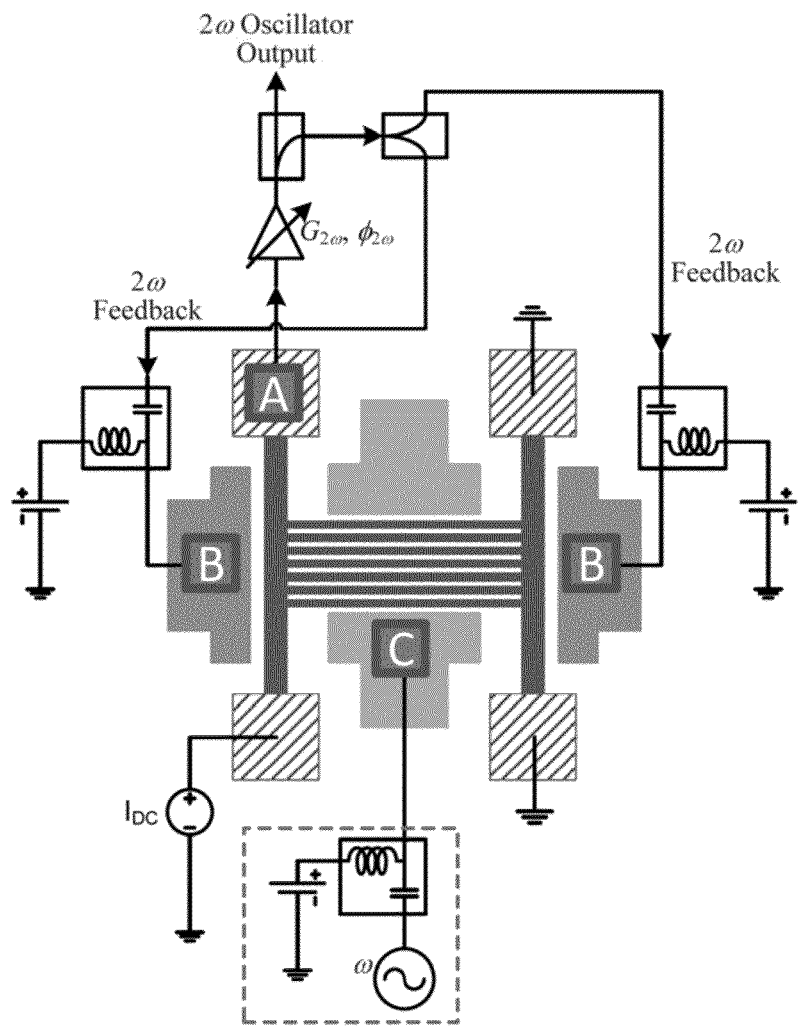
FIG. 15B is a diagram showing a second design of a piezoresistive nanowire parametric oscillator in which the coupled PZR NW arrays function as the frequency references for the oscillators.

FIG. 15B is a diagram showing a second design of a piezoresistive nanowire parametric oscillator in which the coupled PZR NW arrays function as the frequency references for the oscillators.

Figure 15C:
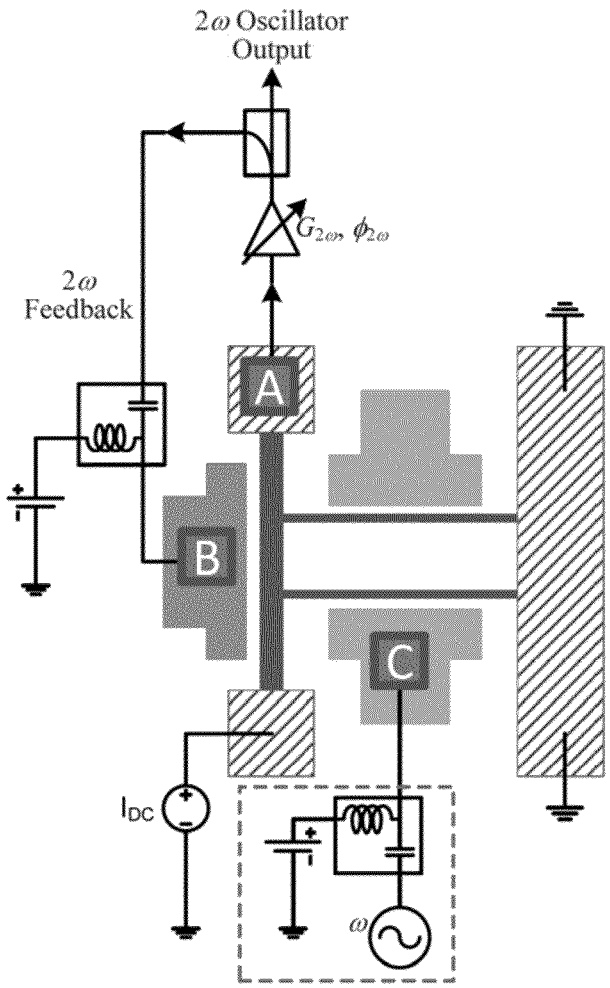
FIG. 15C is a diagram showing a third design of a piezoresistive nanowire parametric oscillator in which the coupled PZR NW arrays function as the frequency references for the oscillators.

FIG. 15C is a diagram showing a third design of a piezoresistive nanowire parametric oscillator in which the coupled PZR NW arrays function as the frequency references for the oscillators.

Figure 15D:
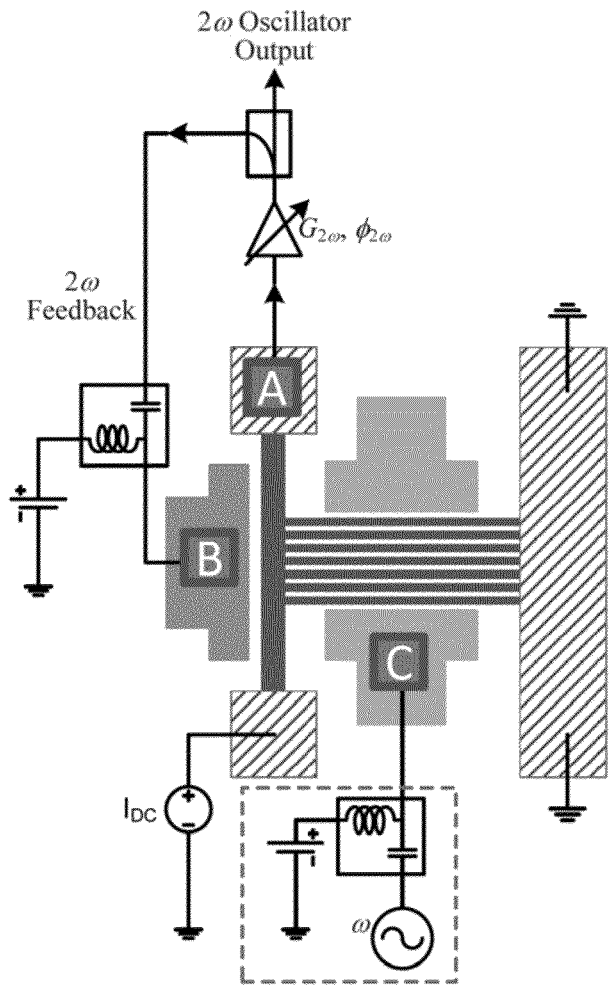
FIG. 15D is a diagram showing a fourth design of a piezoresistive nanowire parametric oscillator in which the coupled PZR NW arrays function as the frequency references for the oscillators.

FIG. 15D is a diagram showing a fourth design of a piezoresistive nanowire parametric oscillator in which the coupled PZR NW arrays function as the frequency references for the oscillators.

The operation of the designs shown in FIG. 15A and FIG. 15B is analogous to the operation of the design in FIG. 14A, and the operation of the designs shown in FIG. 15C and FIG. 15D is analogous to the operation of the design in FIG. 14B.
Parametric Oscillator via PZR NW Arrays Using Clock Frequencies of ω and 2ω

We have also devised schemes of including several coupled resonators in parallel via possible coupling mechanisms, such as mechanical or electrostatic coupling. Depending on the distribution of the driving nodes, such designs would allow one to generate anti-symmetric modes which would lead to an increase in the measured quality factor. This can provide devices that operate with parametric pumping below threshold power to produce frequency 1ω oscillator using a parametrically-enhanced NW resonator. Above the parametric pumping threshold, the device can operate as a frequency 2ω oscillator.

Figure 16A:
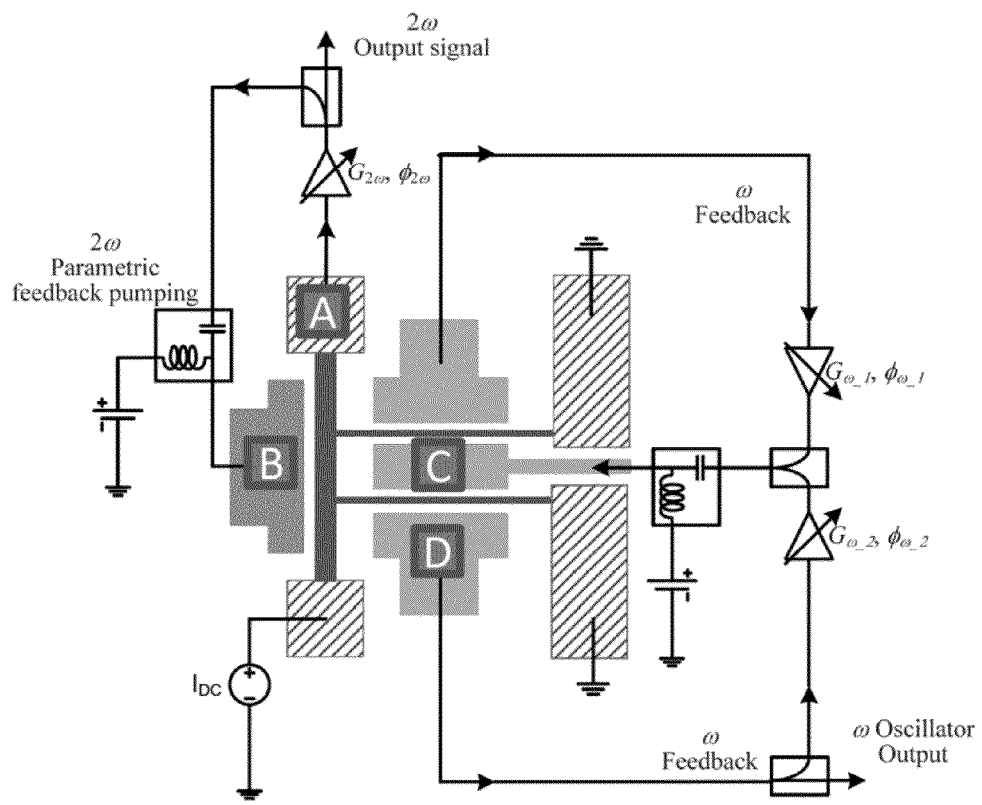
FIG. 16A is a diagram showing a parametric oscillator using a PZR NW array with clock frequencies of ω and 2ω.

FIG. 16A is a diagram showing a parametric oscillator using a PZR NW array with clock frequencies of ω and 2ω.

FIG. 16A is a design in which a pair of nanowires are biased at DC, and as they vibrate at ω, they generate PZR voltage signal at 2ω, which is picked up at gate "A", which is in turn amplified and phase-tuned, to feedback to gate "B". Therefore, this path is a "parametric pumping" as it's 2ω signal tuning the stiffness of the nanowires that are vibrating at ω.

Simultaneously, gate "D" (and its mirrored image on top, the light blue one above "C") picks up the vibration at ω, by mechanisms such as Capacitive or Nanowire Transconductance variations due to nanowire vibration, to generate another voltage signal at ω; this ω signal is amplified and phase-tuned to feedback to gate "C". Therefore, this path is a feedback at ω, and it is directly feeding back to "C" to drive the two nanowires at their vibration frequency ω, to directly compensate the vibrational losses (energy dissipation).

Hence, this design can realize the following:
(1) If ω feedback to "C" is strong enough to compensate the vibrational losses, self-sustained oscillation will be realized at clock frequency ω, using the nanowire resonance as frequency references.
(2) While (1) is realized, adding 2ω 'pumping' feedback to "B", if this 'pumping' is below threshold, it will simply enhance the nanowire resonance signal strength and quality factor, hence a better frequency reference for the self-sustained oscillation in (1) with a clock frequency at ω, then it will have better performance such as lower phase noise, and higher stability.
(3) If the 2ω 'pumping' signal at gate "B" is increased, and gets above a threshold, then 2ω self-sustained oscillations are also realized in the feedback look involving gate "A" and "B" and can be picked up at "A". In this case. The same set of physical devices can realize two clocks at same time, one is at ω, and one is at 2ω, output at different ports of the system.
(4) Another feature is the 2 nanowires in the design of FIG. 16A will vibrate in anti-symmetric mode shape, therefore reduce mechanical losses, and give high quality factor.

Figure 16B:
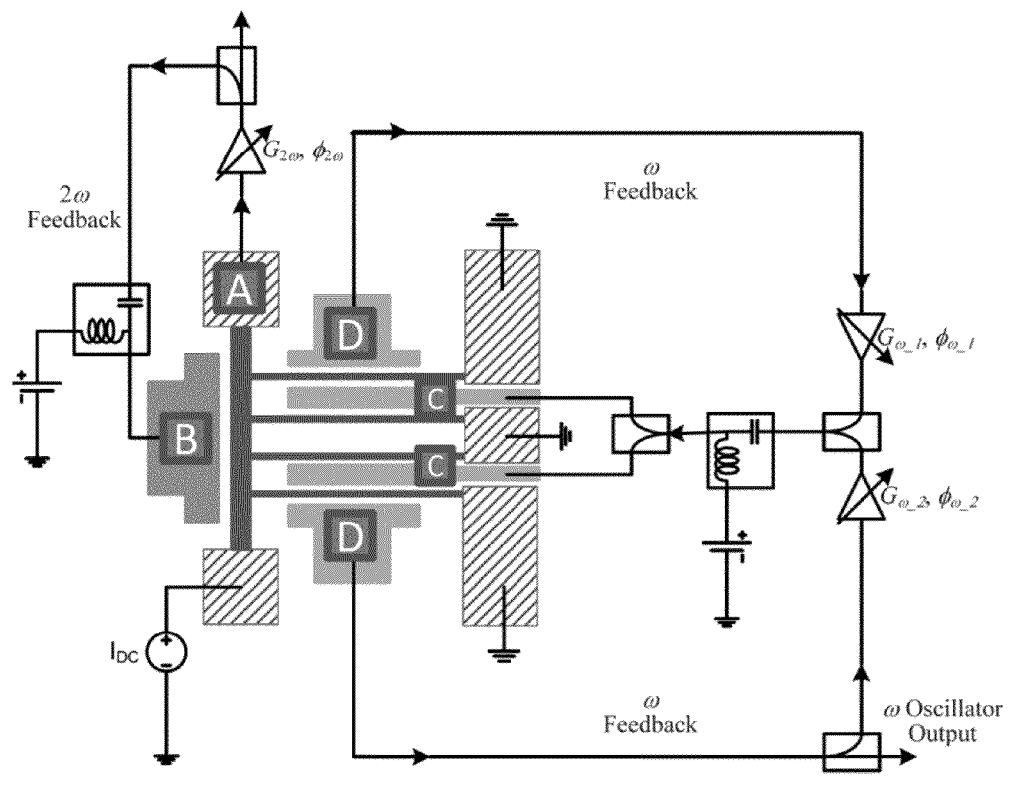
FIG. 16B is a diagram showing another parametric oscillator using a PZR NW array with clock frequencies of ω and 2ω.

FIG. 16B is a diagram showing another parametric oscillator using a PZR NW array with clock frequencies of ω and 2ω.

FIG. 16B is a design is similar to FIG. 16A, but has twice the number of nanowires, to enhance the signal and power handling capability. All of the features (1)-(4) described as regards FIG. 16A are valid for this design as well.

The operation of the devices shown in FIG. 16A and FIG. 16B are analogous to the operation described with regard to a combination of FIG. 12B and FIG. 14B.

Torsional Resonators with Frequency 2ω Piezoresistive Nanowires

We now describe torsional resonators supported by PZR NWs. The $1^{st}$-order torsional shear stress in the supporting PZR NWs induce $2^{nd}$-order longitudinal elongation strain ($\epsilon_L$) that is proportional to the square of the torsional motion ($\epsilon_L \propto \theta^2$) Therefore, for torsional resonance motion at frequency ω, there is a frequency 2ω PZR signal for detection in the NWs.

The longitudinal strain due to torsion-induced elongation is given by:

$$\varepsilon_L = \frac{\Delta L}{L} \approx \frac{1}{2}\left(\frac{1}{2} \cdot \frac{(r\theta)^2}{L^2} - \frac{(r\theta)^4}{8L^2} + ...\right)$$

The PZR signal at frequency 2ω in NW, with θ oscillating at frequency ω is given by:

$$\frac{\Delta R}{R} = G \cdot \frac{\Delta L}{L} \approx \frac{1}{4} G \cdot \left(\frac{r}{L}\right)^2 \theta^2$$

For rectangular NW cross section, w×t (with w comparable to t), the effective resistance is given by r≈wt/π². The PZR signal on both sides of the NWs are additive. A torsional paddle attached to the nanowire can be excited by laterally-patterned electrostatically-coupled gates, or by on-chip magnetomotive or inductive actuation. The systems and methods useful for realizing oscillators and parametric oscillators can be readily transferred to torsional resonators with PZR NWs.

Figures 17A, 17B:
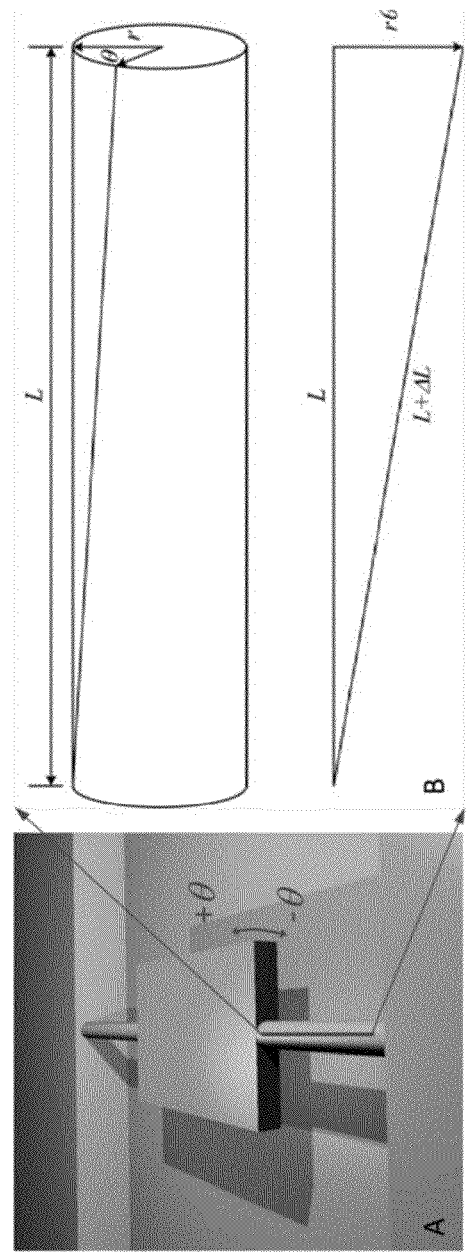
FIG. 17A is a schematic illustration showing a torsional resonator that operates according to the principles analyzed in FIG. 17B
FIG. 17B is a schematic diagram show the analysis of a torsional resonator, consisting of a paddle (which can be rectangular, polygonal, circular or other shapes) supported by a piezoresistive nanowire, generating a 2ω piezoresistive signal.

FIG. 17A is a schematic illustration showing a torsional resonator, with a paddle supported by a thin nanowire, which is operating in the principle analyzed in FIG. 17B.

FIG. 17B is a schematic for analyzing the torsional strain and torsional piezoresistive effect that depends quadratically on the torsional angle θ, displaced from equilibrium position. When the torsional vibration is at frequency ω, the torsional angle θ is also at frequency ω, and therefore the torsional vibration generated piezoresistance within the nanowire is at frequency 2ω.

DEFINITIONS

As used herein, the term "excitation" means the AC Drive signal that drives/excites the nanowires into vibrations. The nanowire resonators will follow the Excitation/Drive frequency. By way of example, if the excitation is at 100 MHz, the nanowire will follow the drive, and will exhibit a "forced vibration" at 100 MHz. This is a 1ω excitation.

As used herein, the term "Pumping" or "Parametric Pumping" means that the stiffness of the nanowire periodically changes with such applied pumping forces. By way of example, if the spring constant of the nanowire changes at twice of the nanowire's vibration frequency. This is a 2ω pumping.

Unless otherwise explicitly recited herein, any reference to an electronic signal or an electromagnetic signal (or their equivalents) is to be understood as referring to a non-volatile electronic signal or a non-volatile electromagnetic signal.

Recording the results from an operation or data acquisition, such as for example, recording results at a particular frequency or wavelength, is understood to mean and is defined herein as writing output data in a non-transitory manner to a storage element, to a machine-readable storage medium, or to a storage device. Non-transitory machine-readable storage media that can be used in the invention include electronic, magnetic and/or optical storage media, such as magnetic floppy disks and hard disks; a DVD drive, a CD drive that in some embodiments can employ DVD disks, any of CD-ROM disks (i.e., read-only optical storage disks), CD-R disks (i.e., write-once, read-many optical storage disks), and CD-RW disks (i.e., rewriteable optical storage disks); and electronic storage media, such as RAM, ROM, EPROM, Compact Flash cards, PCMCIA cards, or alternatively SD or SDIO memory; and the electronic components (e.g., floppy disk drive, DVD drive, CD/CD-R/CD-RW drive, or Compact Flash/PCMCIA/SD adapter) that accommodate and read from and/or write to the storage media. Unless otherwise explicitly recited, any reference herein to "record" or "recording" is understood to refer to a non-transitory record or a non-transitory recording.

As is known to those of skill in the machine-readable storage media arts, new media and formats for data storage are continually being devised, and any convenient, commercially available storage medium and corresponding read/write device that may become available in the future is likely to be appropriate for use, especially if it provides any of a greater storage capacity, a higher access speed, a smaller size, and a lower cost per bit of stored information. Well known older machine-readable media are also available for use under certain conditions, such as punched paper tape or cards, magnetic recording on tape or wire, optical or magnetic reading of printed characters (e.g., OCR and magnetically encoded symbols) and machine-readable symbols such as one and two dimensional bar codes. Recording image data for later use (e.g., writing an image to memory or to digital memory) can be performed to enable the use of the recorded information as output, as data for display to a user, or as data to be made available for later use. Such digital memory elements or chips can be standalone memory devices, or can be incorporated within a device of interest. "Writing output data" or "writing an image to memory" is defined herein as including writing transformed data to registers within a microcomputer.

"Microcomputer" is defined herein as synonymous with microprocessor, microcontroller, and digital signal processor ("DSP"). It is understood that memory used by the microcomputer, including for example instructions for data processing coded as "firmware" can reside in memory physically inside of a microcomputer chip or in memory external to the microcomputer or in a combination of internal and external memory. Similarly, analog signals can be digitized by a standalone analog to digital converter ("ADC") or one or more ADCs or multiplexed ADC channels can reside within a microcomputer package. It is also understood that field programmable array ("FPGA") chips or application specific integrated circuits ("ASIC") chips can perform microcomputer functions, either in hardware logic, software emulation of a microcomputer, or by a combination of the two. Apparatus having any of the inventive features described herein can operate entirely on one microcomputer or can include more than one microcomputer.

General purpose programmable computers useful for controlling instrumentation, recording signals and analyzing signals or data according to the present description can be any of a personal computer (PC), a microprocessor based computer, a portable computer, or other type of processing device. The general purpose programmable computer typically comprises a central processing unit, a storage or memory unit that can record and read information and programs using machine-readable storage media, a communication terminal such as a wired communication device or a wireless communication device, an output device such as a display terminal, and an input device such as a keyboard. The display terminal can be a touch screen display, in which case it can function as both a display device and an input device. Different and/or additional input devices can be present such as a pointing device, such as a mouse or a joystick, and different or additional output devices can be present such as an enunciator, for example a speaker, a second display, or a printer. The computer can run any one of a variety of operating systems, such as for example, any one of several versions of Windows, or of MacOS, or of UNIX, or of Linux. Computational results obtained in the operation of the general purpose computer can be stored for later use, and/or can be displayed to a user. At the very least, each microprocessor-based general purpose computer has registers that store the results of each computational step within the microprocessor, which results are then commonly stored in cache memory for later use.

Many functions of electrical and electronic apparatus can be implemented in hardware (for example, hard-wired logic), in software (for example, logic encoded in a program operating on a general purpose processor), and in firmware (for example, logic encoded in a non-volatile memory that is invoked for operation on a processor as required). The present invention contemplates the substitution of one implementation of hardware, firmware and software for another implementation of the equivalent functionality using a different one of hardware, firmware and software. To the extent that an implementation can be represented mathematically by a transfer function, that is, a specified response is generated at an output terminal for a specific excitation applied to an input terminal of a "black box" exhibiting the transfer function, any implementation of the transfer function, including any combination of hardware, firmware and software implementations of portions or segments of the transfer function, is contemplated herein, so long as at least some of the implementation is performed in hardware.

Theoretical Discussion

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Any patent, patent application, or publication identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. An electromechanical resonant apparatus, comprising:
   a doubly clamped nanowire electromechanical resonator having a fundamental flexural frequency $\omega$ and having sufficient conductivity to provide a piezoresistive signal, said doubly clamped nanowire electromechanical resonator having an excitation input terminal, a bias input terminal, and a resonator output terminal, said doubly clamped nanowire electromechanical resonator configured to generate a piezoresistive signal at a frequency of $2\omega$ (twice said fundamental flexural frequency $\omega$) in response to an applied excitation signal having an amplitude greater than an oscillation threshold, and configured to generate a piezoresistive signal at the fundamental flexural frequency $\omega$ in response to an applied excitation signal having an amplitude less than said oscillation threshold, and to provide said generated signal at said resonator output terminal;

an excitation source configured to provide at an output terminal thereof said excitation signal to said excitation input terminal of said doubly clamped nanowire electromechanical resonator, said excitation source having a terminal configured to be connected to a reference voltage, and having a control for controlling at least one of an amplitude and a frequency of said excitation signal; and a bias source configured to provide at an output terminal thereof a bias signal to said bias input terminal of said doubly clamped nanowire electromechanical resonator, said bias source having a terminal configured to be connected to a reference voltage, and having a control for controlling at least one of an amplitude and a frequency of said bias signal.

2. The electromechanical resonant apparatus of claim 1, wherein said bias source applies a DC bias signal and said output signal of said doubly clamped nanowire electromechanical resonator is observed at a frequency equal to $2\omega$.

3. The electromechanical resonant apparatus of claim 1, wherein said bias source applies an AC bias signal at a frequency $2\omega+\Delta\omega$ and said output signal of said doubly clamped nanowire electromechanical resonator is observed at a frequency equal to $\Delta\omega$.

4. The electromechanical resonant apparatus of claim 1, wherein said apparatus further comprises a controller for controlling the excitation source and for controlling the bias source.

5. The electromechanical resonant apparatus of claim 4, wherein said controller is a general purpose programmable computer configured to operate under instructions recorded on a machine readable medium.

6. The electromechanical resonant apparatus of claim 1, wherein said electromechanical resonant apparatus is an electromechanical oscillator.

7. The electromechanical resonant apparatus of claim 1, wherein said electromechanical resonant apparatus is a parametric oscillator.

8. The electromechanical resonant apparatus of claim 1, wherein said electromechanical resonant apparatus is a torsional resonator.

9. The electromechanical resonant apparatus of claim 1, wherein said doubly clamped nanowire electromechanical resonator has two excitation input terminals and is configured to receive excitation signals at each excitation input terminal.

10. The electromechanical resonant apparatus of claim 1, wherein said excitation source comprises an AC excitation source and a DC excitation source.

11. The electromechanical resonant apparatus of claim 1, wherein said doubly clamped nanowire electromechanical resonator comprises a plurality of doubly clamped nanowire electromechanical resonators.

12. The electromechanical resonant apparatus of claim 11, wherein said apparatus comprises a plurality of resonator output terminals, wherein a first of said plurality of resonator output terminals is configured to provide an output signal of frequency $\omega$, and a second of said plurality of resonator output terminals is configured to provide an output signal of frequency $2\omega$.

13. A method of generating a parametric oscillation signal, comprising the steps of:

providing an electromechanical resonant apparatus, comprising:
a doubly clamped nanowire electromechanical resonator having a fundamental flexural frequency $\omega$ and having sufficient conductivity to provide a piezoresistive signal, said doubly clamped nanowire electromechanical resonator having an excitation input terminal, a bias input terminal, and a resonator output terminal, said doubly clamped nanowire electromechanical resonator configured to generate a piezoresistive signal at a frequency of $2\omega$ (twice said fundamental flexural frequency $\omega$) in response to an applied excitation pumping signal having an amplitude greater than an oscillation threshold, and to provide said generated signal at said resonator output terminal;

an excitation source configured to provide at an output terminal thereof said excitation signal to said excitation input terminal of said doubly clamped nanowire electromechanical resonator, said excitation source having a terminal configured to be connected to a reference voltage, and having a control for controlling at least one of an amplitude and a frequency of said excitation signal; and a bias source configured to provide at an output terminal thereof a bias signal to said bias input terminal of said doubly clamped nanowire electromechanical resonator, said bias source having a terminal configured to be connected to a reference voltage, and having a control for controlling at least one of an amplitude and a frequency of said bias signal;

applying an excitation signal having frequency $\omega$ and having a desired excitation amplitude; and receiving as output a parametric oscillation signal having a frequency $2\omega$ (twice said fundamental flexural frequency $\omega$) if said desired excitation amplitude is greater than said oscillation threshold.

14. The method of generating a parametric oscillation signal of claim 13, wherein a bias signal having a desired bias frequency and having a desired bias amplitude is provided at said bias input terminal, and receiving as output a parametric oscillation signal at a frequency $2\omega$ if said bias signal is a DC signal, and receiving as output a parametric oscillation signal at a frequency equal to $\Delta\omega$ if said bias signal is an AC bias signal at a frequency $2\omega+\Delta\omega$.

* * * * *